United States Patent
Noda et al.

(10) Patent No.: US 7,528,662 B2
(45) Date of Patent: May 5, 2009

(54) SIGNAL AMPLIFICATION APPARATUS AND SIGNAL AMPLIFICATION METHOD

(75) Inventors: Takahiro Noda, Tokyo (JP); Toshihiko Masuda, Tokyo (JP); Manabu Yamanaka, Tokyo (JP); Takashi Takano, Tokyo (JP)

(73) Assignee: Sony Corporation, Tokyo (JP)

( * ) Notice: Subject to any disclaimer, the term of this patent is extended or adjusted under 35 U.S.C. 154(b) by 67 days.

(21) Appl. No.: 11/490,191

(22) Filed: Jul. 21, 2006

(65) Prior Publication Data

US 2007/0030075 A1 Feb. 8, 2007

(30) Foreign Application Priority Data

Jul. 25, 2005 (JP) ............... 2005-214680

(51) Int. Cl.
*H03F 3/04* (2006.01)
(52) U.S. Cl. .............. 330/297; 330/251; 330/207 A
(58) Field of Classification Search ......... 330/297, 330/136, 10, 207 A, 251
See application file for complete search history.

(56) References Cited

U.S. PATENT DOCUMENTS 6,825,726 B2 * 11/2004 French et al. ............... 330/297
7,091,777 B2 * 8/2006 Lynch ..................... 330/136
7,193,470 B2 * 3/2007 Lee et al. .................. 330/285

FOREIGN PATENT DOCUMENTS

| JP | 57-11507 | 1/1982 |
| JP | 3-250805 | 11/1991 |
| JP | 4-262608 | 9/1992 |
| JP | 9-148851 | 6/1997 |

* cited by examiner

*Primary Examiner*—Robert Pascal
*Assistant Examiner*—Hieu P Nguyen
(74) *Attorney, Agent, or Firm*—Oblon, Spivak, McClelland, Maier & Neustadt, P.C.

(57) ABSTRACT

A signal amplification apparatus which supplies an input signal to a signal processing section to perform signal processing on the input signal, amplifies a power supply voltage supplied from a power source section in accordance with the processed signal, and outputs the amplified power supply voltage. The apparatus includes output decrease prediction means for predicting decrease of the output signal on the basis of an amplitude of the input signal; power supply voltage correction signal generation means for generating a power supply voltage correction signal for correcting the power supply voltage of the power source section on the basis of the predicted decrease of the output signal; and feedforward control means for performing feedforward control of the power supply voltage of the power source section by using the power supply voltage correction signal.

12 Claims, 8 Drawing Sheets

FIG. 8A CHANNEL 1 SPEAKER OUTPUT

FIG. 8B CHANNEL 2 SPEAKER OUTPUT

FIG. 8C CHANNEL X SPEAKER OUTPUT

FIG. 8D ALL CHANNELS ADDED SIGNAL  GND

FIG. 8E VOLTAGE APPLIED TO POWER MOS WITHOUT VARIATION

FIG. 8F DECREASE VARIATION OF VOLTAGE APPLIED TO POWER MOS

FIG. 9A CHANNEL 1 SPEAKER OUTPUT

FIG. 9B CHANNEL 2 SPEAKER OUTPUT

FIG. 9C CHANNEL X SPEAKER OUTPUT

FIG. 9D ALL CHANNELS ADDED SIGNAL  GND

FIG. 9E VOLTAGE APPLIED TO POWER MOS WITHOUT VARIATION

FIG. 9F DECREASE VARIATION OF VOLTAGE APPLIED TO POWER MOS

FIG. 10A  CHANNEL 1 SPEAKER OUTPUT

FIG. 10B  CHANNEL 2 SPEAKER OUTPUT

FIG. 10C  CHANNEL X SPEAKER OUTPUT

FIG. 10D  ALL CHANNELS ADDED SIGNAL

FIG. 10E  VOLTAGE APPLIED TO POWER MOS WITHOUT VARIATION

FIG. 10F  DECREASE VARIATION OF VOLTAGE APPLIED TO POWER MOS

FIG. 11A  CHANNEL 1 SPEAKER OUTPUT

FIG. 11B  CHANNEL 2 SPEAKER OUTPUT

FIG. 11C  CHANNEL X SPEAKER OUTPUT

FIG. 11D  ALL CHANNELS ADDED SIGNAL

FIG. 11E  VOLTAGE APPLIED TO POWER MOS WITHOUT VARIATION

FIG. 11F  DECREASE VARIATION OF VOLTAGE APPLIED TO POWER MOS

FIG. 12A VOLTAGE APPLIED TO POWER MOS (BEFORE CORRECTION)

FIG. 12B IDEAL SWITCHING PULSE OF POWER MOS

FIG. 12C SWITCHING PULSE OF POWER MOS DURING POWER SUPPLY VOLTAGE VARIATION

FIG. 13A VOLTAGE APPLIED TO POWER MOS (AFTER CORRECTION)

FIG. 13B IDEAL SWITCHING PULSE OF POWER MOS

FIG. 13C SWITCHING PULSE OF POWER MOS DURING POWER SOURCE CORRECTION

FIG. 14

SIGNAL AMPLIFICATION APPARATUS AND SIGNAL AMPLIFICATION METHOD

CROSS REFERENCES TO RELATED APPLICATIONS

The present document contains subject matter related to Japanese Patent Application JP 2005-214680 filed in the Japanese Patent Office on Jul. 25, 2005, the entire contents of which being incorporated herein by reference.

BACKGROUND OF THE INVENTION

1. Field of the Invention

The present invention relates to, for example, a signal processing apparatus and method for performing signal processing on an input signal, amplifying a power supply voltage in accordance with the processed signal, and outputting the amplified power supply voltage as an output signal.

2. Description of Related Art

Figure 14:
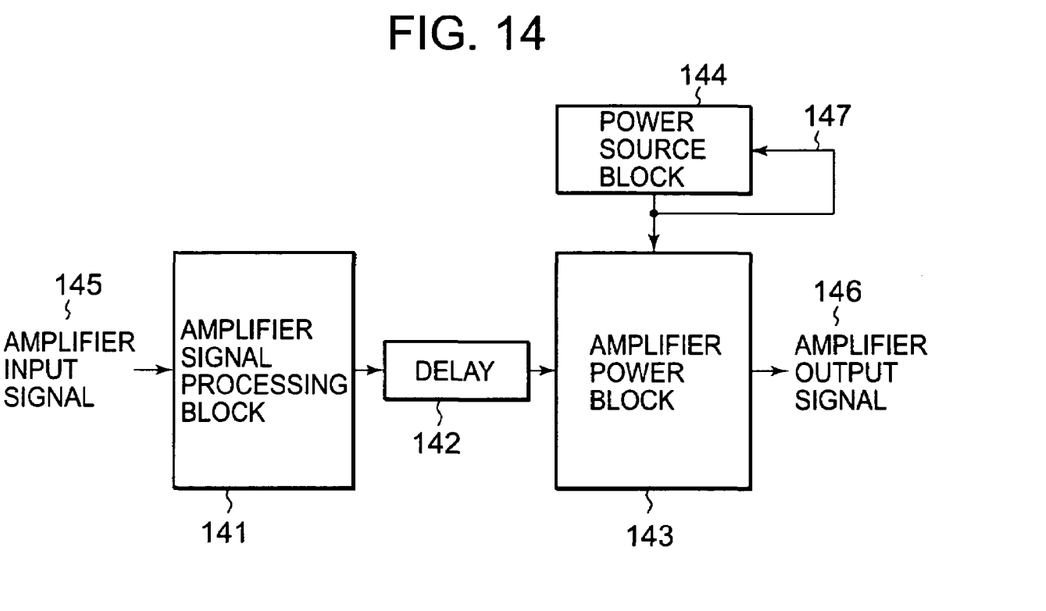
FIG. 14 is a block diagram showing a related art digital amplifier system.

FIG. 14 is a block diagram of a related art digital amplifier system. In FIG. 14, an amplifier signal processing block 141 performs predetermined signal processing on an amplifier input signal 145, and a delay device 2 delays the processed signal by the amount of delay occurring in the digital amplifier system, in order to adjust the output timing of an amplifier power block 143. Then, a power source block 144 outputs a constant power supply voltage to the amplifier power block 143 under feedback control 147, and the amplifier power block 143 amplifies the power supply voltage in accordance with the level of the delayed signal and outputs an amplifier output signal 146.

The amplifier power block 143 of the digital amplifier system cuts out the power supply voltage supplied from the power source block 144 by means of the switching operation of its power MOS (metal oxide semiconductor). The voltage cut out by the power MOS is desirably a stable constant voltage, and if a voltage variation occurs, the voltage variation directly influences an audio output signal such as the amplifier output signal 13 and produces distortion of the audio output signal. In general, to suppress the voltage variation, the output of the power source block 144 is fed back (as indicated at 147) to the power source block 144 itself so as to suppress a variation of the output voltage.

Figure 12A:
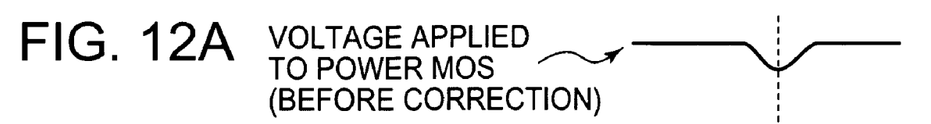
FIG. 12A shows a voltage applied to the power MOS (after correction)
Figure 12B:
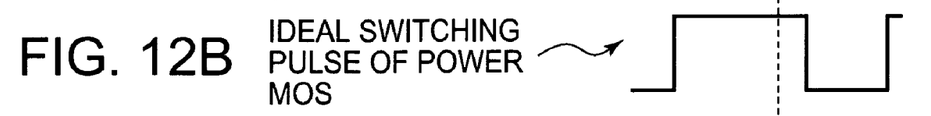
FIG. 12B shows an ideal switching pulse of 20 the power MOS.
Figure 12C:
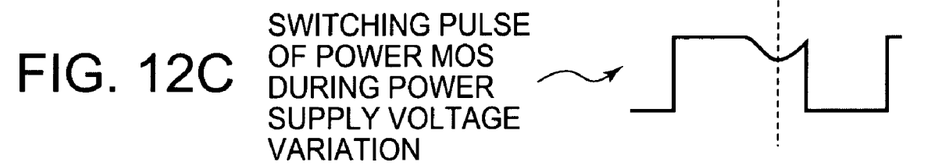
FIG. 12C shows a switching pulse of the power MOS during the power supply voltage variation.

FIGS. 12A to 12C are graphs showing waveform distortions due to a power supply voltage variation, and FIG. 12A shows a voltage applied to the power MOS (after correction), FIG. 1-2B shows an ideal switching pulse of the power MOS, and FIG. 13C shows a switching pulse of the power MOS during the power supply voltage variation.

If the level of the signal delayed by the delay device 142 increases and a lowering variation occurs in the power supply voltage supplied from the power source block 144, the voltage applied to the power MOS shown in FIG. 14A (before correction) lowers from a constant voltage by the amount of the variation of the power supply voltage. As a result, the power MOS switching pulse during the power supply voltage variation shown in FIG. 12C lowers by the amount of the variation of the power supply voltage compared to the ideal power MOS switching pulse shown in FIG. 12B.

An audio switching power source has been proposed which is constructed to determine a pulse modulated signal for determining a direct-current output value of an AC-DC conversion section by means of a pulse control section on the bias of the amplitude value of a sequentially inputted digital input signal, the audio switching power source being operative to correct the direct current output voltage at the same timing as an increase of the amplitude of the digital input signal by outputting an audio signal which is power-amplified by a digital power amplification section after having delaying the digital input signal (refer to Japanese Patent Application Publication Laid-Open Number Hei 9-148851).

A power supply circuit for a power amplifier has also been proposed which varies a power supply voltage to be supplied to a power amplification device of the power amplifier, in accordance with the envelope of a signal level based on an input signal (refer to Japanese Patent Application Publication Laid-Open Number Sho 57-11507). Furthermore, a multi-signal amplifier is known which varies a bias voltage to be supplied to a power amplification circuit, in accordance with the number of input signals (refer to Japanese Patent Application Publication Laid-Open Number Hei 3-250805). In addition, a solid-state power amplifier has also heretofore been known which detects an input and an output and performs dynamic adjustment of an operation point for dynamically adjusting a direct-current bias to be supplied to the amplifier (refer to Japanese Patent Application Publication Laid-Open Number Hei 4-262608).

SUMMARY OF THE INVENTION

However, in a case where the power source block 144 of feedback control architecture is used as a power source of a digital amplifier, none of the above-mentioned related art power source apparatuses can follow a voltage variation due to the amplifier power block 143, so that a distortion due to a power supply voltage variation occurs.

In addition, any of the arts described in the above patent documents is constructed to detect a signal level during a constant period and perform switching of the power source by using the pulse width, in order to supplying power according to the signal level. Accordingly, even with these arts, it is difficult to follow a power variation due to a load variation in real time, so that there is the disadvantage that a distortion due to the power supply voltage variation occurs.

The present invention, therefore, provides a signal amplification apparatus and a signal amplification method both of which can correct the distortion of an output signal by predicting a voltage variation of a power source and causing the output signal to follow the voltage variation in real time.

To solve the above-mentioned problems, in accordance with an embodiment of the present invention, there is provided a signal amplification apparatus which supplies an input signal to a signal processing section to perform signal processing on the input signal, amplifies a power supply voltage supplied from a power source section in accordance with the processed signal, and outputs the amplified power supply voltage. The signal simplification apparatus includes output decrease prediction means, power supply voltage correction signal generation means, and feedforward control means. The output decrease prediction means predicts a decrease of the output signal on the basis of amplitude of the input signal. The power supply voltage correction signal generation means generates a power supply voltage correction signal for correcting the power supply voltage of the power source section on the bias of the predicted lowering of the output signal. The feedforward control means performs feedforward control of the power supply voltage of the power source section by using the power supply voltage correction signal.

According to the embodiment, for example, in a signal processing section of a digital amplifier, the input signals on all the channels are added together and the result is used for the feedforward control of the power source section so as to suppress a power supply voltage variation, thereby suppressing distortion of an audio output signal due to the power supply voltage variation. The embodiment of the present invention can also be applied to a digital amplifier of analog input architecture having an analog-to-digital converter at the front stage of its signal processing section.

Since the power supply voltage variation depends on the sum of the output signal levels of all the channels, the feedforward signal to be applied to the power source section is calculated by adding the input signals on all the channels. It is noted that the feedforward signal differs according to whether the power source section has single-ended architecture or bridge tied load (BTL) architecture. In the case of the single-ended architecture, the generation of the feedforward signal is realized by simple adding processing of the input signal levels and sign inversion processing as well as an amplifier for adjusting gain.

In addition, a delay circuit may be added to each of the signal processing section output of the digital amplifier and the feedforward output to the power source section in order to synchronize the correction of a voltage variation of the power source section by the feedforward signal and the timing of signal output.

According to the embodiment of the present invention, it is possible to cause the output signal to follow the power supply voltage variation in real time by predicting the power supply voltage variation, generating the feedforward signal corresponding to the voltage variation, and performing feedforward control on the power source section.

BRIEF DESCRIPTION OF THE DRAWINGS

The invention will become more readily appreciated and understood from the following detailed description of preferred and specific embodiments of the invention when taken in conjunction with the accompanying drawings, in which:

FIGS. 8A to 8F are graphs showing a power supply voltage variation in the BTL architecture (a waveform example 1)

FIGS. 9A to 9F are graphs showing a power supply voltage variation in the BTL architecture (a waveform example 2)

FIGS. 10A to 10F are graphs showing a power supply voltage variation in the single-ended architecture (a waveform example 1)

FIGS. 11A to 11F are graphs showing a power supply voltage variation in the single-ended architecture (a waveform example 1)

FIGS. 12A to 12C are graphs showing waveform distortions due to a power supply voltage variation.

FIGS. 13A to 13C are graphs showing undistorted waveforms after the correction of a power supply voltage 25 variation.

DESCRIPTION OF THE EMBODIMENTS

Figure 1:
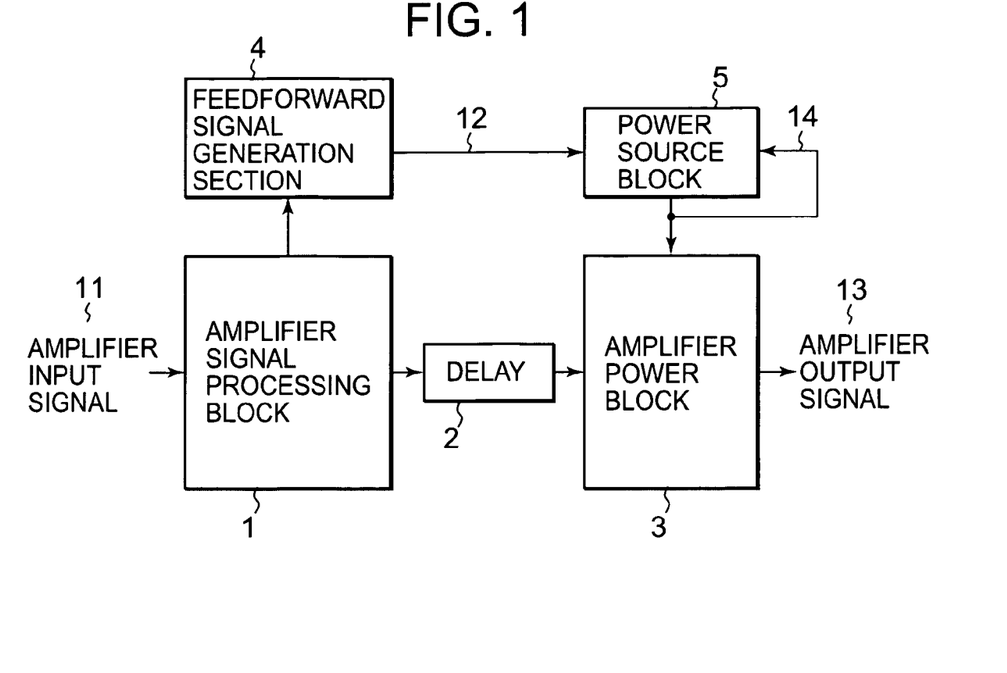
FIG. 1 is a block diagram of a digital amplifier system according to an embodiment of the present invention.

Embodiments of the present invention will be described below with reference to the accompanying drawings. FIG. 1 is a block diagram of a digital amplifier system according to an embodiment of the present invention.

In FIG. 1, an amplifier signal processing block 1 performs predetermined signal processing on an amplifier input signal 11, and a delay device 2 causes the signal processed by the amplifier signal processing block 1 to delay by the amount of delay occurring in the digital amplifier system, in order to adjust the output timing of an amplifier power block 3. Then, a power source block 5 outputs a constant power supply voltage to the amplifier power block 3 under feedback control 14, and the amplifier power block 3 amplifies the power supply voltage in accordance with the level of the delayed signal and outputs an amplifier output signal 13. This construction is similar to a related art shown in FIG. 14.

In this construction, the amplifier power block 3 of the digital amplifier system cuts out the power supply voltage supplied from the power source block 5 by means of the switching operation of its power MOS on the basis of a pulse obtained by integrating the signal delayed by the delay device 2. The voltage cut out by the power MOS is desirably a stable constant voltage. This is because if a voltage variation occurs, the voltage variation directly influences an audio output signal such as the amplifier output signal 13 and produces distortion of the audio output signal.

For this reason, the digital amplifier system according to the embodiment of the present invention is provided with a feedforward signal generation section 4. The feedforward signal generation section 4 calculates by addition the all channel amplifier input signal 11 inputted to the amplifier signal processing block 1, and predicts a lowering of the amplifier output signal 13 on the basis of an amplitude variation of the amplifier input signal 11. Namely, the prediction of the output decreasing of the amplifier output signal 13 is performed by predicting the time for which and the level to which the amplifier output signal 13 decreases in accordance with the time for which and the amplitude level at which the amplifier input signal 11 takes place.

The feedforward signal generation section 4 generates a power supply voltage correction signal 12 for correcting the predicted decrease of the amplifier output signal 13, and supplies the power supply voltage correction signal 12 to the power source block 5. The power supply voltage correction signal 12 is used for power supply voltage feedforward control in order to correct the power supply voltage of the power source block 5.

In this manner, the feedforward signal generation section 4 can suppress the distortion of the amplifier output signal 13 due to the power supply voltage variation by restraining the power supply voltage variation by using the power supply voltage correction signal 12 for the feedforward control of the power source block 5.

In general, digital amplifiers are in almost all cases used in applications which need to amplify and output signals on a plurality of channels. In the following description, by way of example, reference will be made to a specific embodiment applied to audio signals on three channels which are the left or L channel, the right or R channel and the center or C channel.

Figure 2:
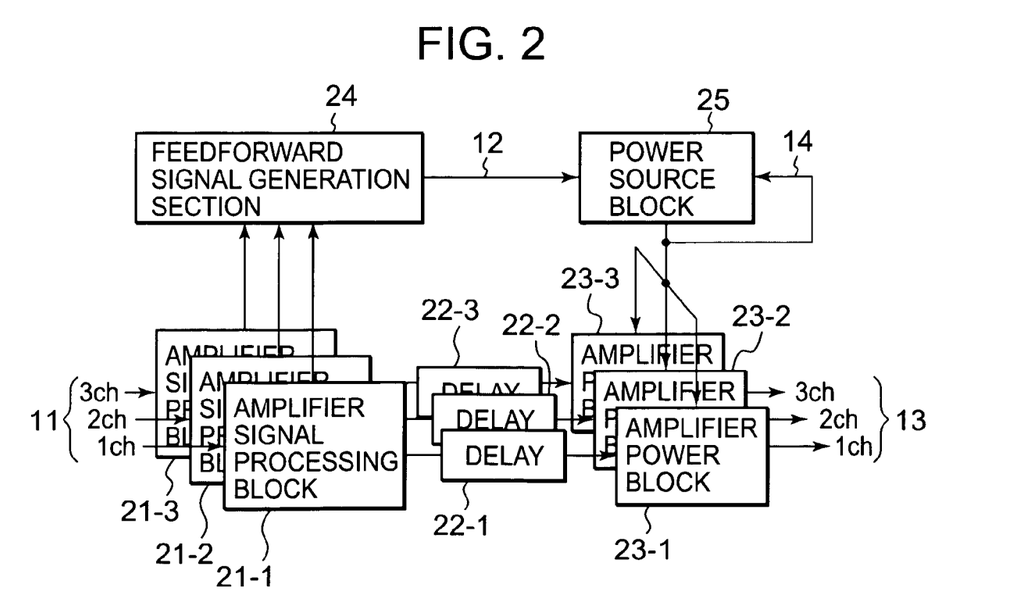
FIG. 2 is a block diagram of a digital amplifier system for three channels.

FIG. 2 is a block diagram of a digital amplifier system for three channels, for example. Referring to FIG. 2, amplifier signal processing blocks 21-1, 21-2 and 21-3 respectively perform predetermined signal processing on the amplifier input signals 11 on the first channel, the second channel and the third channel, and supply the respective processed signals to delay devices 22-1, 22-2 and 22-3. The respective delay devices 22-1, 22-2 and 22-3 cause the processed signals on the first, second and third channels to delay by the amount of delay occurring in the digital amplifier system, in order to adjust the output timing of the amplifier power blocks 23-1, 23-2 and 23-3.

Meanwhile, a power source block 25 outputs a constant power supply voltage to each of amplifier power blocks 23-1, 23-2 and 23-3 under the feedback control 14. The respective amplifier power blocks 23-1, 23-2 and 23-3 receive the output signals from the power source block 25 and amplify the supplied power supply voltages in accordance with the levels of the signals on the first, second and third channels delayed by the delay devices 22-1, 22-2 and 22-3, and output the amplifier output signals 13 on the first, second and third channels.

In this digital amplifier system, the respective amplifier power blocks 23-1, 23-2 and 23-3 cut out the power supply voltages supplied from the power source block 25 by means of the switching operation of their power MOSs on the basis of pulses obtained by integrating the signals on the first, second and third channels after having been delayed by the delay devices 22-1, 22-2 and 22-3. As mentioned previously with reference to the block diagram of FIG. 1, the power supply voltage cut out by each of the amplifier power blocks 23-1, 23-2 and 23-3 is desirably a stable constant voltage. This is because if a voltage variation occurs in the power source block 25, the voltage variation directly influences audio output signals such as the amplifier output signals 13 and produces distortion of the audio output signals.

For this reason, the 3-channel digital amplifier system shown in FIG. 2 is also provided with a feedforward signal generation section 24. The feedforward signal generation section 24 adds together the amplifier input signals 11 on all of the first, second and third channels, which have been inputted to the respective amplifier signal processing blocks 21-1, 21-2 and 21-3, and predicts decreases of the respective amplifier output signals 13 on the basis of amplitude variations of the amplifier input signals 11 on all of the first, second and third channels.

The prediction of the output decreases of the amplifier output signals 13 is performed by predicting the times for which and the levels to which the amplifier output signals 13 on all of the first, second and third channels respectively lower in accordance with the times for which and the amplitude levels at which the amplifier input signals 11 on all of the first, second and third channels take place, respectively.

Similarly to the feedforward signal generation section 4 shown in FIG. 1, the feedforward signal generation section 24 generates the power supply voltage correction signal 12 for correcting the predicted decreases of the respective amplifier output signals 13, and supplies the power supply voltage correction signal 12 to the power source block 25. The power supply voltage correction signal 12 is used for power supply voltage feedforward control in order to correct the power supply voltage of the power source block 25.

In this manner, the feedforward signal generation section 24 can suppress the distortions of the amplifier output signals 13 on all of the first, second and third channels due to the power supply voltage variation by restraining the power supply voltage variation by using the power supply voltage correction signal 12 for the feedforward control of the power source block 25.

Figure 3:
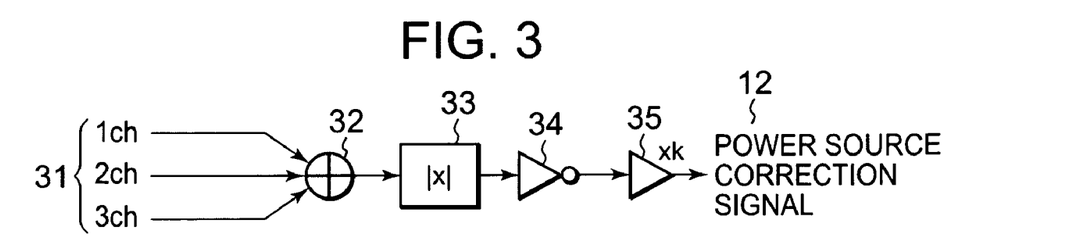
FIG. 3 is a block diagram of a feedforward signal generation section for a power source block having BTL architecture.

FIG. 3 is a block diagram of a feedforward signal generation section for a power source block having bridge tied load (BTL) architecture. Referring to FIG. 3, since the power supply voltage variation depends on a full-load signal 31 which is the sum of the output signals on all of the first, second and third channels, the power supply voltage correction signal 12 which is a feedforward signal to be applied to the power source block 25 is obtained by adding together the input signals on all of the first, second and third channels at an adder 32.

Decreases of the output levels of the amplifier output signals 13 are predicted from the signal obtained by the addition processing by the adder 32. The decreases of the respective output levels are detected by predicting in real time the amplitude levels of the amplifier input signals 11 and the times for which level variations occur in the respective amplifier input signals 11. The power supply voltage correction signal 12 which is the feedforward signal differs according to whether the power source block 25 has single-ended architecture or BTL architecture.

Figure 5:
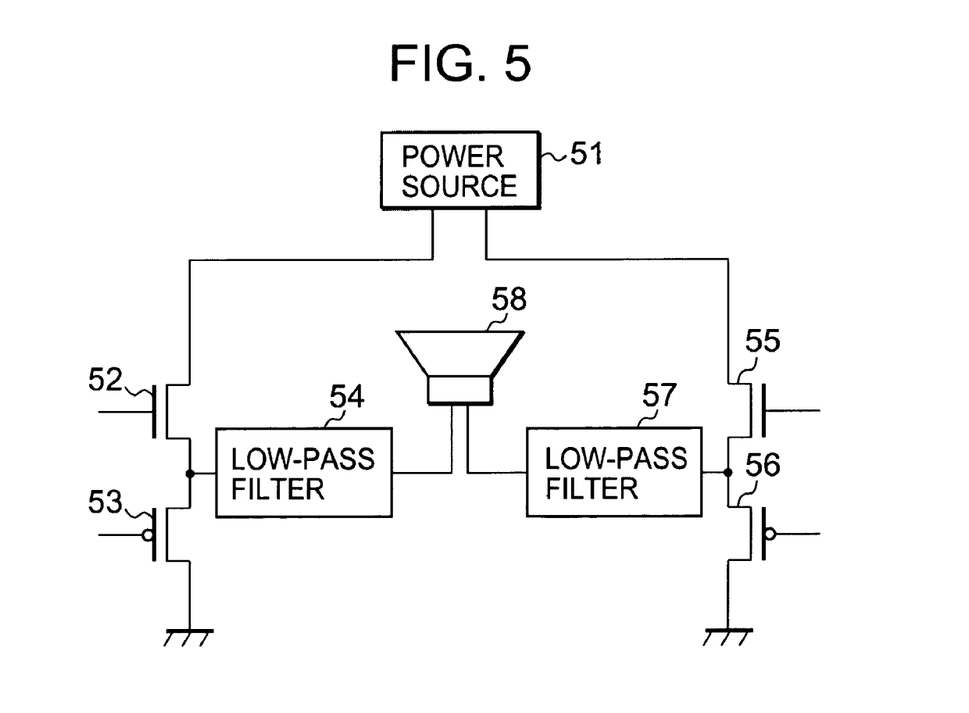
FIG. 5 is a circuit diagram of an amplifier power block of BTL architecture.

FIG. 5 is a circuit diagram of an amplifier power block of BTL architecture. In FIG. 5, when pulses which respectively act to turn on an nMOS 52 and a pMOS 56 (pulses obtained by integrating a signal on each corresponding one of the channels) are inputted to their respective gates, a current based on a power supply voltage supplied from a power source 51 is amplified by flowing from the source to the drain of the nMOS 52, and is acoustically outputted from a speaker 58 as one amplifier output signal waveform-shaped by a low-pass filter 54. At this time, the other amplifier output signal flows to ground via a low-pass filter 57 and the pMOS 56.

When pulses which respectively act to turn on an nMOS 55 and a pMOS 53 (pulses obtained by integrating signals on each corresponding one of the channels) are inputted to their respective gates, a current based on a power supply voltage supplied from the power source 51 is amplified by flowing from the source to the drain of the nMOS 55, and is acoustically outputted from the speaker 58 as one amplifier output signal waveform-shaped by the low-pass filter 57. At this time, the other amplifier output signal flows to ground via the low-pass filter 54 and the pMOS 53.

Accordingly, in the amplifier power block of BTL architecture, since one amplifier output signal and the other amplifier output signal flow in the mutually opposite directions, it is necessary to acquire the absolute value of the full-load signal 31 which is calculated at the adder 32 by using an absolute value circuit 33, in order to predict decreases of the respective signal levels of one amplifier output signal and the other amplifier output signal.

Then, the signal after the absolute value processing by the absolute value circuit 33 is sign-inverted by an inverter 34, and this sign-inverted signal is amplified by a factor k into the power supply voltage correction signal 12 by means of an amplifier 35. This factor k is selected to become a factor which acts to correct the predicted level decrease of the amplifier output signal 13.

As mentioned above, in the case of BTL architecture, since the power supply voltage variation is approximately equal to a signal obtained by adding together the audio signals on all the channels and inverting the sign of only the signal having an amplitude on the plus side, the obtained signal is fed forward to the power source to predict a power supply voltage variation. The generation of the power supply voltage correction signal 12 which is to be the feedforward signal can be realized by simple mix processing and sign inversion processing as well as a multiplier for adjusting gain.

Figure 4:
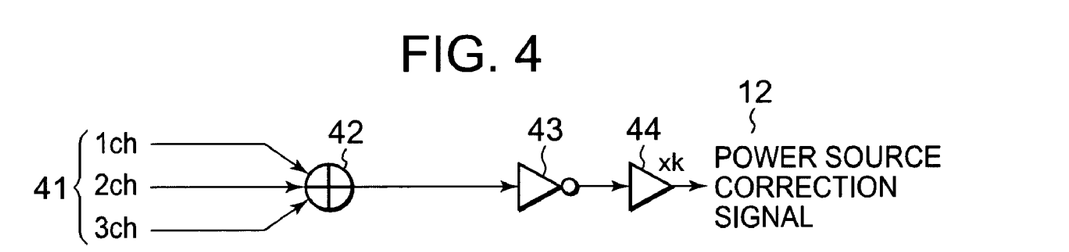
FIG. 4 is a block diagram of a feedforward signal generation section for a power source block having single-ended architecture.

FIG. 4 is a block diagram of a feedforward signal generation section for a power source block having single-ended architecture. In FIG. 4, since the power supply voltage variation depends on a full-load signal 41 which is the sum of the output signals on all of the first, second and third channels, the power supply voltage correction signal 12 which is to be a feedforward signal to be applied to the power source block 25 is obtained by adding together the input signals on all of the first, second and third channels at an adder 42. The power source block 25 having single-ended architecture differs in construction from that having the above-mentioned BTL architecture shown in FIG. 3 in signal processing which is performed after the adder 42 in order to generate the power supply voltage correction signal 12.

Figure 6:
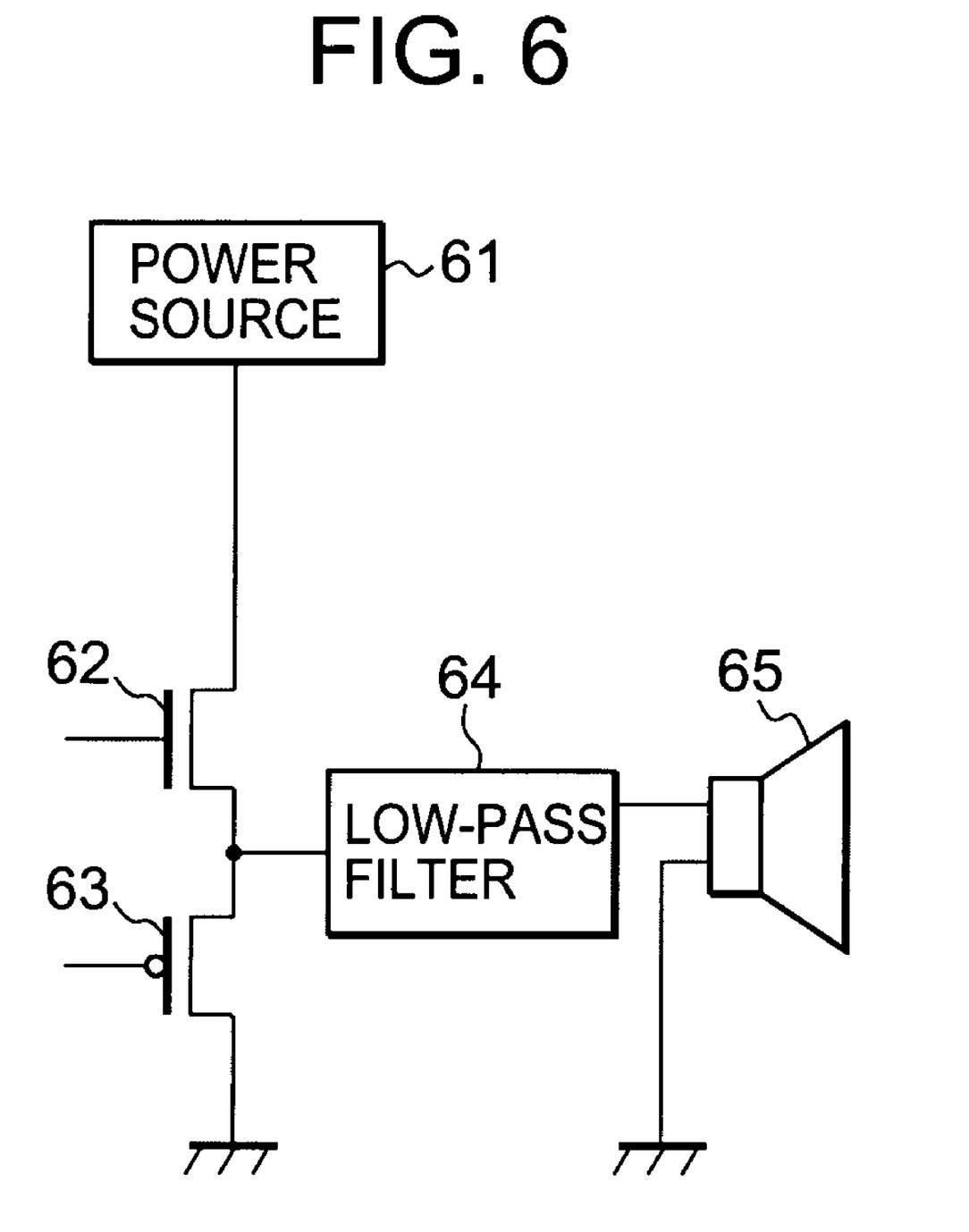
FIG. 6 is a circuit diagram of an amplifier power block of single-ended architecture.

An amplifier power block of single-ended architecture will be described below. FIG. 6 is a circuit diagram of an amplifier power block of single-ended architecture. In FIG. 6, when a pulse obtained by integrating a signal on each corresponding one of the channels, which respectively act to turn on an nMOS 62, is inputted to its gate, a current based on a power supply voltage supplied from a power source 61 is amplified by flowing from the source to the drain of the nMOS 62, and is acoustically outputted from a speaker 65 as an amplifier output signal waveform-shaped by a low-pass filter 64. When the amplifier output signal is not outputted from the speaker 65, the amplifier output signal flows to ground via a pMOS 63.

Accordingly, in the amplifier power block of single-ended architecture, since an amplifier output signal flows in one direction, it is not necessary to acquire the absolute value of the full-load signal 41 which is calculated at the adder 42, in order to predict a decrease of the signal level of the amplifier output signal. At this time, a level decrease of the amplifier output signal 13 is predicted from the signal obtained by the addition processing by the adder 42. The decreases of the amplifier output signals 13 are detected by predicting in real time the amplitude levels of the amplifier input signals 11 and the times for which amplitude variations occur in the respective amplifier input signals 11.

Then, the signal after the addition is sign-inverted by an inverter 43, and this sign-inverted signal is amplified by the factor k into the power supply voltage correction signal 12 by means of an amplifier 44. Similarly to the factor k in the amplifier 35 shown in FIG. 3, the factor k is selected to become a factor which acts to correct the predicted level decrease of the amplifier output signal 13.

As mentioned above, in the case of single-ended architecture, since the power supply voltage variation is approximately equal to a signal obtained by adding together the audio signals on all the channels, inverting the sign of the added signal, and multiplying the sing-inverted signal by a certain gain, the obtained signal is fed forward to the power source in advance. Accordingly, the generation of the power supply voltage correction signal 12 which is the feedforward signal can be realized merely by using simple mix processing and sign inversion processing as well as a multiplier for adjusting gain.

In addition, similarly to the feedforward signal generation section for the BTL architecture shown in FIG. 3, the feedforward signal generation section for the single-ended architecture may further have the absolute value circuit 33 for performing absolute value processing. In this case, the constructions of the feedforward signal generation sections 24 for both architectures may be standardized. In addition, since the gain of the feedforward signal to be applied to the power source block 25 needs to be selected to have an optimum value according to the output power of each individual amplifier to be used, the gain needs to be set to an optimum value during system design.

In addition, the delay devices 22-1, 22-2 and 22-3 are respectively provided between the amplifier signal processing blocks 21-1, 21-2 and 21-3 and the amplifier power blocks 23-1, 23-2 and 23-3 in order to synchronizing the processing of correcting the voltage variation of the power source block 25 by using the power supply voltage correction signal 12 generated by the feedforward signal generation section 24, with the output timing of the amplifier output signals 13 from the respective amplifier power blocks 23-1, 23-2 and 23-3. Since the delay time of each of the delay devices 22-1, 22-2 and 22-3 is a constant value unique to the system, it is necessary to measure the delay of the system and set the delay time during system design.

Figure 7:
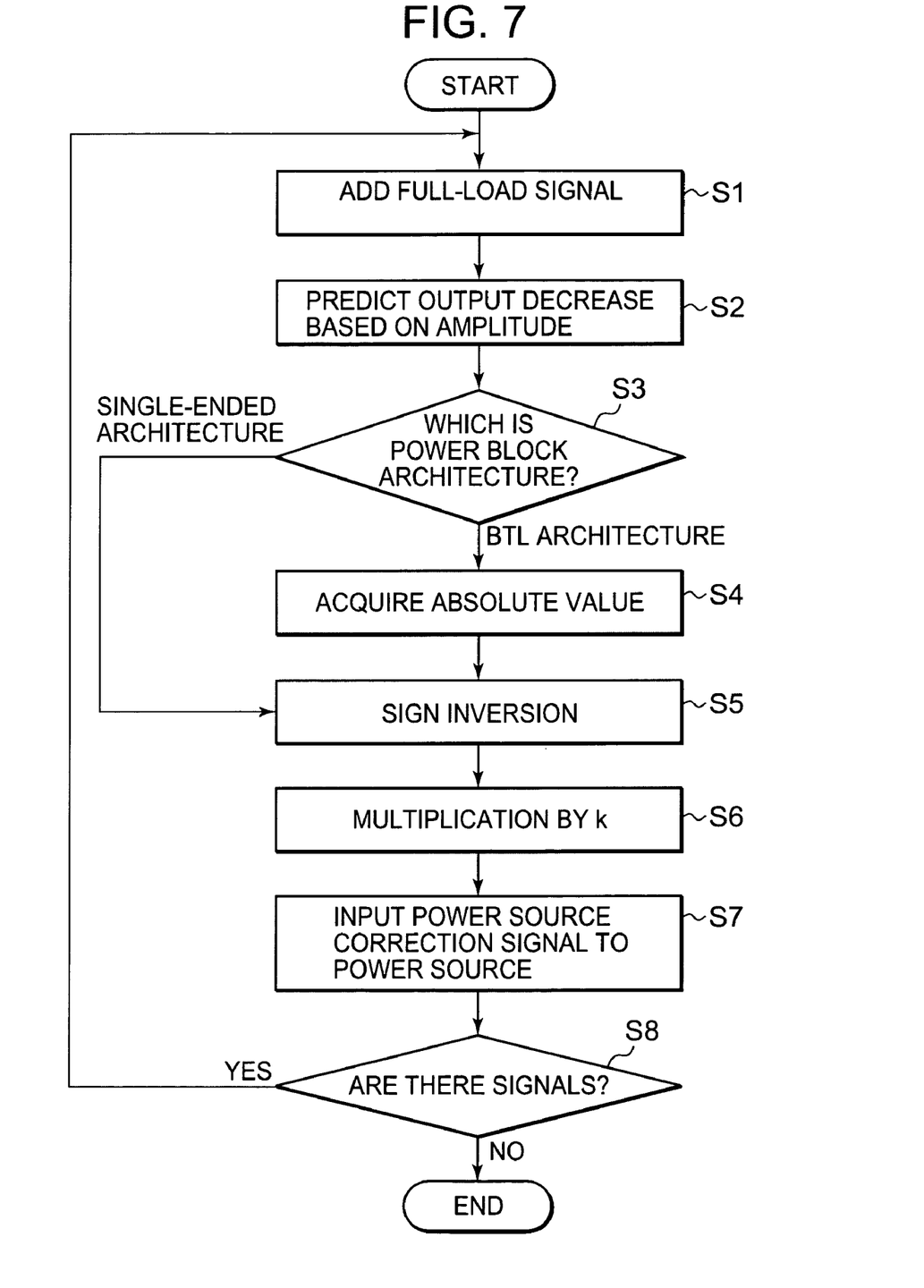
FIG. 7 is a flowchart showing a feedforward signal generation operation.

The operation of the feedforward signal generation section 24 will be described below with reference to the flowchart shown in FIG. 7. In FIG. 7, first of all, a full-load signal is calculated by addition (step S1). Specifically, the full-load signal 31 which is the sum of the output signal on all of the first, second and third channels is calculated at the adder 32.

Then, an output decrease due to amplitude is predicted (step S2). Specifically, a lowering of the output level of the amplifier output signal 13 is predicted from the added signal after the addition. The lowering of the output level of the amplifier output signal 13 is detected by predicting in real time the amplitude level of the amplifier input signal 11 and the time for which an amplitude variation occurs in the amplifier input signal 11.

Figures 8A, 8B:
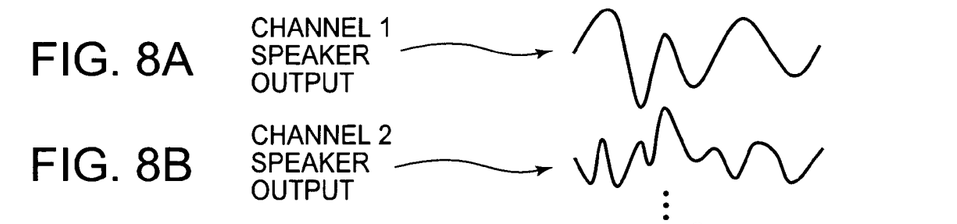
FIG. 8A shows a channel 1 speaker output.
FIG. 8B shows a channel 2 speaker output.
Figure 8C:
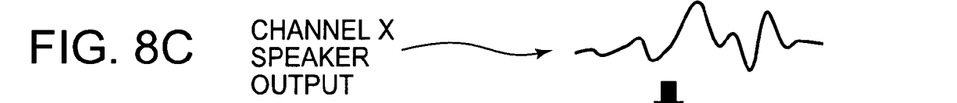
FIG. 8C shows a channel X speaker output.
Figure 8D:
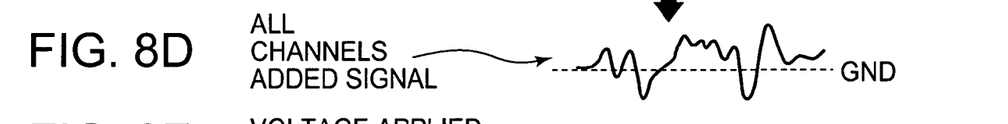
FIG. 8D shows an all channel added signal.
Figures 8E, 8F:
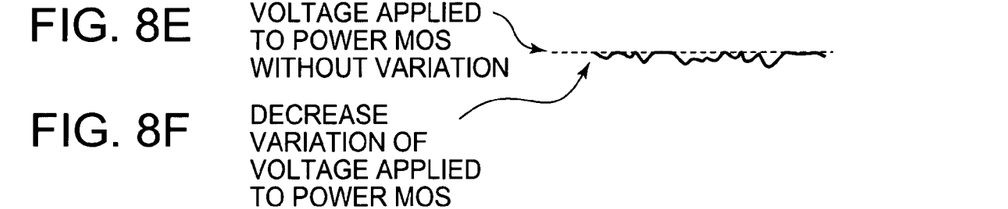
FIG. 8E shows a voltage applied to a power MOS without a variation.
FIG. 8F shows a decreasing variation of a voltage applied to the power MOS.

FIGS. 8A to 8F are graphs showing a power supply voltage variation in the BTL architecture, that is, a waveform example 1 in which each channel has a different variation. FIG. 8A shows a channel 1 speaker output, FIG. 8B shows a channel 2 speaker output, FIG. 8C shows a channel X speaker output, and FIG. 8D shows an all channel added signal obtained by adding together the channel 1 speaker output, the channel 2 speaker output and the channel X speaker output. FIG. 8F shows a signal obtained by predicting a decrease variation of a voltage applied to the power MOS from a voltage applied to the power MOS without a variation, shown in FIG. 8E, in the case of the added signal shown in FIG. 8D.

Figure 9A:
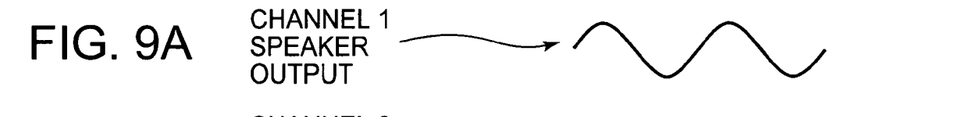
FIG. 9A shows a channel 1 speaker output.
Figures 9B, 9C, 9D:
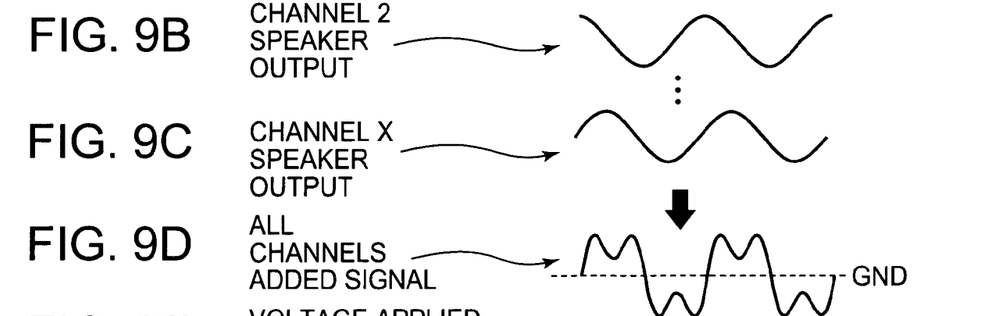
FIG. 9B shows a channel 2 speaker output.
FIG. 9C shows a channel X speaker output.
FIG. 9D shows an all channel added signal.
Figures 9E, 9F:
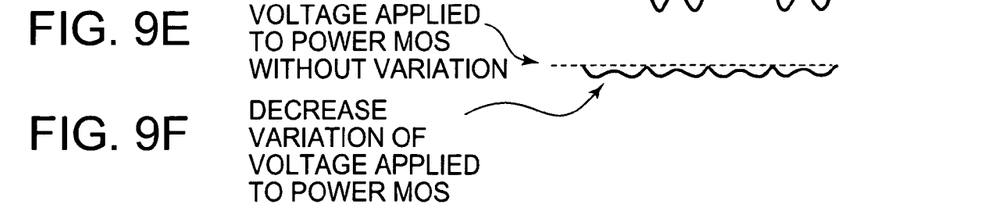
FIG. 9E shows a voltage applied to the power MOS without a variation.
FIG. 9F shows a decreasing variation of a voltage applied to the power MOS.

FIGS. 9A to 9F are graphs showing a power supply voltage variation in the BTL architecture, that is, a waveform example 2 in which each channel has the same variation but differs in phase. FIG. 9A shows a channel 1 speaker output, FIG. 9B shows a channel 2 speaker output, FIG. 9C shows a channel X speaker output, and FIG. 9D shows an all channel added signal obtained by adding together the channel 1 speaker output, the channel 2 speaker output and the channel X speaker output. FIG. 9F shows a signal obtained by predicting a decrease variation of a voltage applied to the power MOS from a voltage applied to the power MOS without a variation, shown in FIG. 9E, in the case of the added signal shown in FIG. 9D.

Figures 10A, 10B:
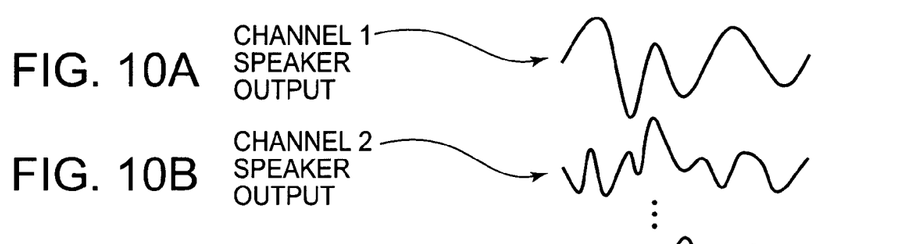
FIG. 10A shows a channel 1 speaker output.
FIG. 10B shows a channel 2 speaker output.
Figures 10C, 10D:
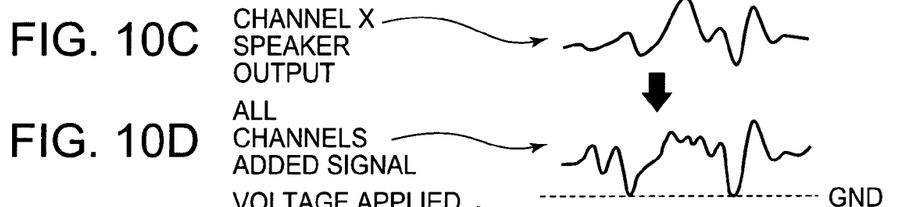
FIG. 10C shows a channel X speaker output.
FIG. 10D shows an all channel added signal.
Figures 10E, 10F:
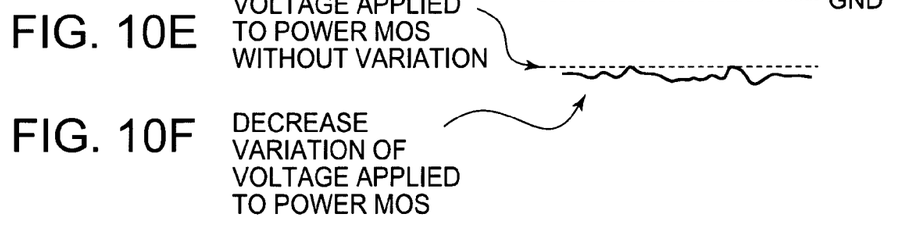
FIG. 10E shows a voltage applied to the power MOS without a variation.
FIG. 10F shows a decreasing variation of a voltage applied to the power MOS.

FIGS. 10A to 10F are graphs showing a power supply voltage variation in the single-ended architecture, that is, a waveform example 1 in which each channel has a different variation. FIG. 10A shows a channel 1 speaker output, FIG. 10B shows a channel 2 speaker output, FIG. 10C shows a channel X speaker output, and FIG. 10D shows an all channel added signal obtained by adding together the channel 1 speaker output, the channel 2 speaker output and the channel X speaker output. FIG. 10F shows a signal obtained by predicting a decrease variation of a voltage applied to the power MOS from a voltage applied to the power MOS without a variation, shown in FIG. 10E, in the case of the added signal shown in FIG. 10D.

Figure 11A:
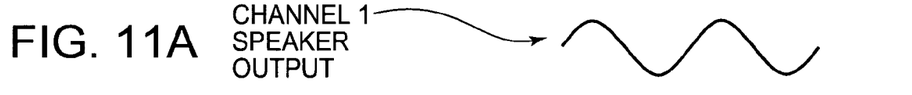
FIG. 11A shows a channel 1 speaker output.
Figure 11B:
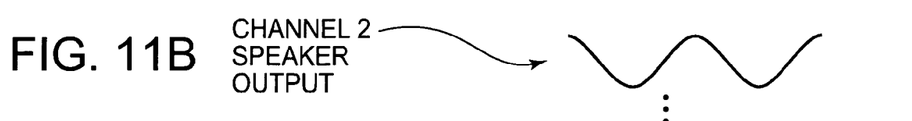
FIG. 11B shows a channel 2 speaker output.
Figures 11C, 11D, 11E:
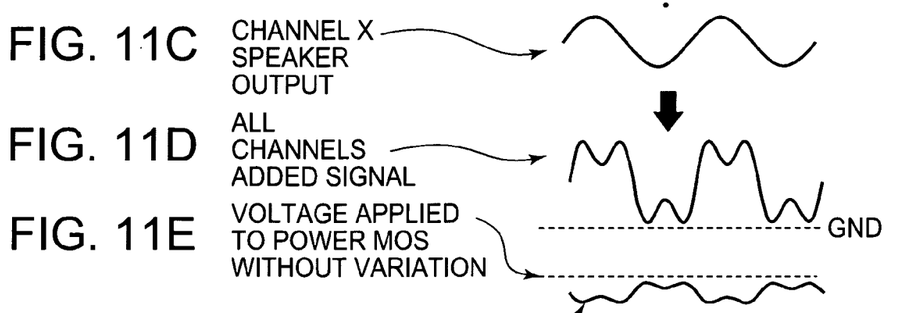
FIG. 11C shows a channel X speaker output.
FIG. 11D shows an all channel added signal.
FIG. 11E shows a voltage applied to the power MOS without a variation.
Figure 11F:
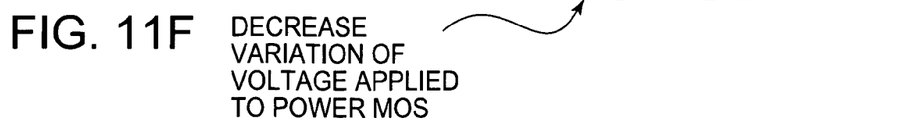
FIG. 11F shows a decreasing variation of a voltage applied to the power MOS.

FIGS. 11A to 11F are graphs showing a power supply voltage variation in the single-ended architecture, that is, a waveform example 2 in which each channel has the same variation but differs in phase. FIG. 11A shows a channel 1 speaker output, FIG. 11B shows a channel 2 speaker output, FIG. 11C shows a channel X speaker output, and FIG. 11D shows an all channel added signal obtained by adding together the channel 1 speaker output, the channel 2 speaker output and the channel X speaker output. FIG. 11F shows a signal obtained by predicting a decrease variation of a voltage applied to the power MOS from a voltage applied to the power MOS without a variation, shown in FIG. 11E, in the case of the added signal shown in FIG. 11D.

Returning to the flowchart of FIG. 7, it is determined whether the architecture of the power block is BTL architecture or single-ended architecture (step S3). If it is determined in step S3 that the architecture of the power block is BTL architecture, an absolute value is acquired (step S4). Specifically, the absolute value of the full-load signal 31 calculated at the adder 32 is acquired by the absolute value circuit 33.

Then, the signal whose absolute value has been acquired by the absolute value circuit 33 is sign-inverted by the inverter 34 (step S5). If it is determined in step S3 that the architecture of the power block is single-ended architecture, the process directly proceeds to step S5, and performs similar sign inversion processing.

Then, a multiplication of factor k is performed by the amplifier 35 (step S6). The multiplication of factor k is performed by amplifying the sign-inverted signal by the amplifier 35 with the factor k which acts to correct the predicted level decrease. Then, the power supply voltage correction signal 12 is inputted to the power source block 25 (step S7). In step S7, feedforward control of the power supply voltage of the power source block 25 is performed by using the power supply voltage correction signal 12 generated by the feedforward signal generation section 24.

Figure 13A:
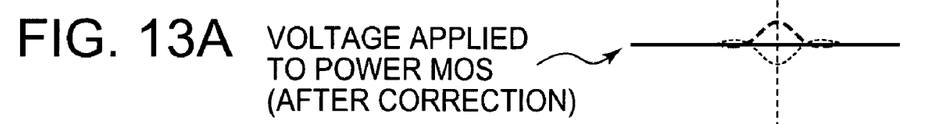
FIG. 13A shows a voltage applied to the power MOS (after the correction)
Figure 13B:
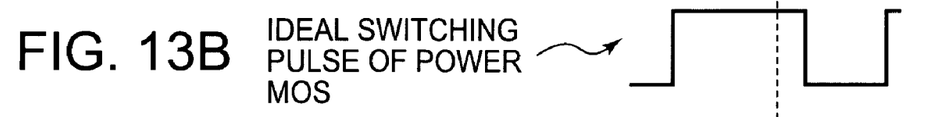
FIG. 13B shows an ideal switching pulse of the power MOS.
Figure 13C:
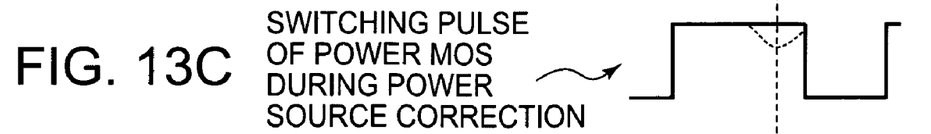
FIG. 13C shows a switching pulse of the power MOS during the power supply voltage correction.

FIGS. 13A to 13C are graphs showing undistorted waveforms after the correction of the power supply voltage variation. Since the voltage applied to the power MOS (after correction) shown in FIG. 13A is increased with respect to the decrease of the power supply voltage, the switching pulse of the power MOS during the power supply voltage correction shown in FIG. 13B is increased to cancel the decrease. The switching pulse is approximately equal to the ideal switching pulse of the power MOS shown in FIG. 13B.

As is apparent from the foregoing description, according to the signal processing according to the embodiment of the present invention, it is possible to suppress the distortion of output sound due to power supply voltage variations. The embodiment of the present invention can also be applied to a digital amplifier of analog input architecture having an analog-to-digital converter at the front stage of its signal processing section, without the need for a large-scale circuit change.

According to the arrangement above, it is possible to suppress distortion generated due to power supply voltage variation, in a digital amplifier. The embodiment of the present invention is easily realized by simple mix processing, gain adjusting processing and addition of a delay circuit. A large scale circuit modification is not necessary.

The above-mentioned embodiments are not limitative, and it goes without saying that those skilled in the art can modify the construction of the present invention as needed without departing from the scope and spirit of the present invention described in the appended claims.

What is claimed is:

1. A digital amplification apparatus which supplies an input signal to a signal processing section to perform signal processing on the input signal, digitally amplifies a power supply voltage supplied from a power source section in accordance with the processed signal, and outputs the amplified power supply voltage, comprising:
    output decrease prediction means for predicting a decrease of the output signal on the basis of an amplitude of the input signal;
    power supply voltage correction signal generation means for generating a power supply voltage correction signal for correcting the power supply voltage of the power source section on the basis of the predicted decrease of the output signal; and
    feedforward control means for performing feedforward control of the power supply voltage of the power source section by using the power supply voltage correction signal.

2. A digital amplification apparatus according to claim 1, wherein in a case where the input signal includes a plurality of channels, the output decrease prediction means uses, as the input signal, an added result of all the channels to which the power supply voltage of the power source section is supplied.

3. A digital amplification apparatus according to claim 1, wherein the output decrease prediction means predicts a time at which the output signal decreases and an amplitude level of the output signal, which correspond to a time at which the input signal takes place and an amplitude level of the input signal.

4. A digital amplification apparatus according to claim 1, wherein the power supply voltage correction signal generation means acquires an absolute value of the amplitude of the input signal, inverts a sign of the absolute value, and amplifies the inverted result by the predicted decrease to generate the power supply voltage correction signal.

5. A digital amplification apparatus according to claim 1, wherein the output decrease prediction means predicts the decrease of the output signal in real time, and the power supply voltage correction signal generation means generates the power supply voltage correction signal in proportion to the decrease of the output signal.

6. A digital amplification apparatus according to claim 1, further comprising a delay mechanism provided between a signal processing section a digital amplifier to synchronize correction of a voltage variation of the power source section by a feedforward signal with a timing of the output signal.

7. A signal amplification method of performing signal processing on an input signal, digitally amplifying a power supply voltage in accordance with the processed signal, and outputting the amplified power supply voltage as an output signal, comprising the steps of:
  predicting a decrease of the output signal on the basis of an amplitude of the input signal;
  generating a power supply voltage correction signal for correcting the power supply voltage on the basis of the predicted decrease of the output signal; and
  using the power supply voltage correction signal to perform feedforward control of the power supply voltage.

8. A digital amplifier that supplies an input signal to a signal processing section to perform signal processing on the input signal, digitally amplifies a power supply voltage supplied from a power source section in accordance with the process signal, and outputs the amplified power output voltage, comprising:
  an output decreased prediction mechanism configured to predict a decrease of the output signal based on an amplitude of the input signal;
  a power supply voltage correction signal generation mechanism configured to generate a power supply voltage correction signal that corrects the power supply voltage of the power source section based on the predicted decrease of the output signal; and
  a feedforward control mechanism configured to perform feedforward control of the power supply voltage of the power source section by using the power supply voltage correction signal.

9. The digital amplifier of claim 8, wherein the output decrease prediction mechanism is configured to predict a time at which the output signal decreases and an amplitude level of the output signal that corresponds to a time at which the input signal takes place and an amplitude level of the input signal.

10. The digital amplifier according to claim 8, wherein the power supply voltage correction signal generation mechanism acquires an absolute value of the amplitude of the input signal, inverts a sign of the absolute value, and amplifies the inverted result by the predicted decrease so as to generate the power supply voltage correction signal.

11. The digital amplifier according to claim 8, wherein the output decrease prediction mechanism is configured to predict the decrease of the output signal in real time and the power supply voltage correction signal generation mechanism is configured to generate the power supply voltage correction signal in proportion to the decrease of the output signal.

12. The digital amplifier of claim 8, further comprising a delay mechanism provided between a signal processing section and digital amplification block to synchronize correction of a voltage variation of the power source section by a feedforward signal with a timing of the output signal.

* * * * *